United States Patent
Ramirez et al.

(10) Patent No.: US 9,286,172 B2
(45) Date of Patent: Mar. 15, 2016

(54) FAULT-AWARE MAPPING FOR SHARED LAST LEVEL CACHE (LLC)

(75) Inventors: Tanausu Ramirez, Barcelona (ES); Javier Carretero Casado, Barcelona (ES); Enric Herrero, Cardedeu (ES); Matteo Monchiero, Menlo Park, CA (US); Xavier Vera, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 13/995,358

(22) PCT Filed: Dec. 22, 2011

(86) PCT No.: PCT/US2011/066953
§ 371 (c)(1),
(2), (4) Date: Jun. 18, 2013

(87) PCT Pub. No.: WO2013/095533
PCT Pub. Date: Jun. 27, 2013

(65) Prior Publication Data
US 2014/0006849 A1    Jan. 2, 2014

(51) Int. Cl.
| | | |
|---|---|---|
| G06F 11/00 | (2006.01) | |
| G06F 11/20 | (2006.01) | |
| G11C 29/12 | (2006.01) | |
| G11C 29/44 | (2006.01) | |
| G11C 29/50 | (2006.01) | |
| G06F 12/08 | (2006.01) | |
| G06F 12/12 | (2006.01) | |
| G11C 29/00 | (2006.01) | |
| G11C 11/41 | (2006.01) | |
| G11C 29/04 | (2006.01) | |

(52) U.S. Cl.
CPC ........ *G06F 11/2053* (2013.01); *G06F 12/0802* (2013.01); *G06F 12/126* (2013.01); *G11C 29/12005* (2013.01); *G11C 29/4401* (2013.01); *G11C 29/50* (2013.01); *G11C 29/702* (2013.01); *G06F 12/084* (2013.01); *G11C 11/41* (2013.01); *G11C 2029/0407* (2013.01); *G11C 2029/5002* (2013.01); *G11C 2029/5004* (2013.01); *Y02B 60/1225* (2013.01)

(58) Field of Classification Search
CPC .............. G06F 12/084; G06F 12/0888; G06F 12/0831; G06F 12/0835; G06F 2212/601; G09G 5/363
See application file for complete search history.

(56) References Cited

U.S. PATENT DOCUMENTS

| | | | |
|---|---|---|---|
| 5,651,125 A  * | 7/1997 | Witt et al. ..................... | 712/218 |
| 6,259,460 B1 | 7/2001 | Gossett et al. | |
| 6,591,347 B2 | 7/2003 | Tischler et al. | |
| 7,536,511 B2 | 5/2009 | Thompson | |

(Continued)

OTHER PUBLICATIONS

Phoenix, "PhoenixBIOS 4.0 Release 6.0" 1997, Phoenix pp. 1-4.*
Gelado, "An Asymmetric Distributed Shared Memory Model for Heterogeneous Parallel Systems" Mar. 13-17, 2010, ACM, pp. 347-358.*
PCT International Search Report for PCT Counterpart Application No. PCT/US2011/066953, 3 pgs., (Sep. 19, 2012).
PCT Written Opinion of the International Searching Authority for PCT Counterpart Application No. PCT/US2011/066953, 3 pgs., (Sep. 19, 2012).

(Continued)

*Primary Examiner* — Bryce Bonzo
*Assistant Examiner* — Jeison C Arcos
(74) *Attorney, Agent, or Firm* — Nicholson De Vos Webster & Elliott LLP

(57) ABSTRACT

Embodiments of systems, apparatuses, and methods for utilizing a faulty cache line in a cache are described. In some embodiments, a graphics processing unit is allowed to access a faulty cache line in the cache. A cache access request to access a faulty cache line from a central processing unit core is remapped to access a fault-free cache line.

24 Claims, 13 Drawing Sheets

(56) References Cited

U.S. PATENT DOCUMENTS

| | | | |
|---|---|---|---|
| 2003/0208658 A1* | 11/2003 | Magoshi | 711/122 |
| 2006/0098022 A1* | 5/2006 | Andrews et al. | 345/557 |
| 2006/0161831 A1* | 7/2006 | Mehalel | 714/758 |
| 2008/0007561 A1* | 1/2008 | Thompson | 345/557 |
| 2011/0252200 A1* | 10/2011 | Hendry et al. | 711/121 |

OTHER PUBLICATIONS

PCT Notification concerning Transmittal of International Preliminary Report on Patentability (Chapter I of the Patent Cooperation Treaty) for PCT Counterpart Application No. PCT/US2011/066953, 5 pgs., (Jul. 3, 2014).

* cited by examiner

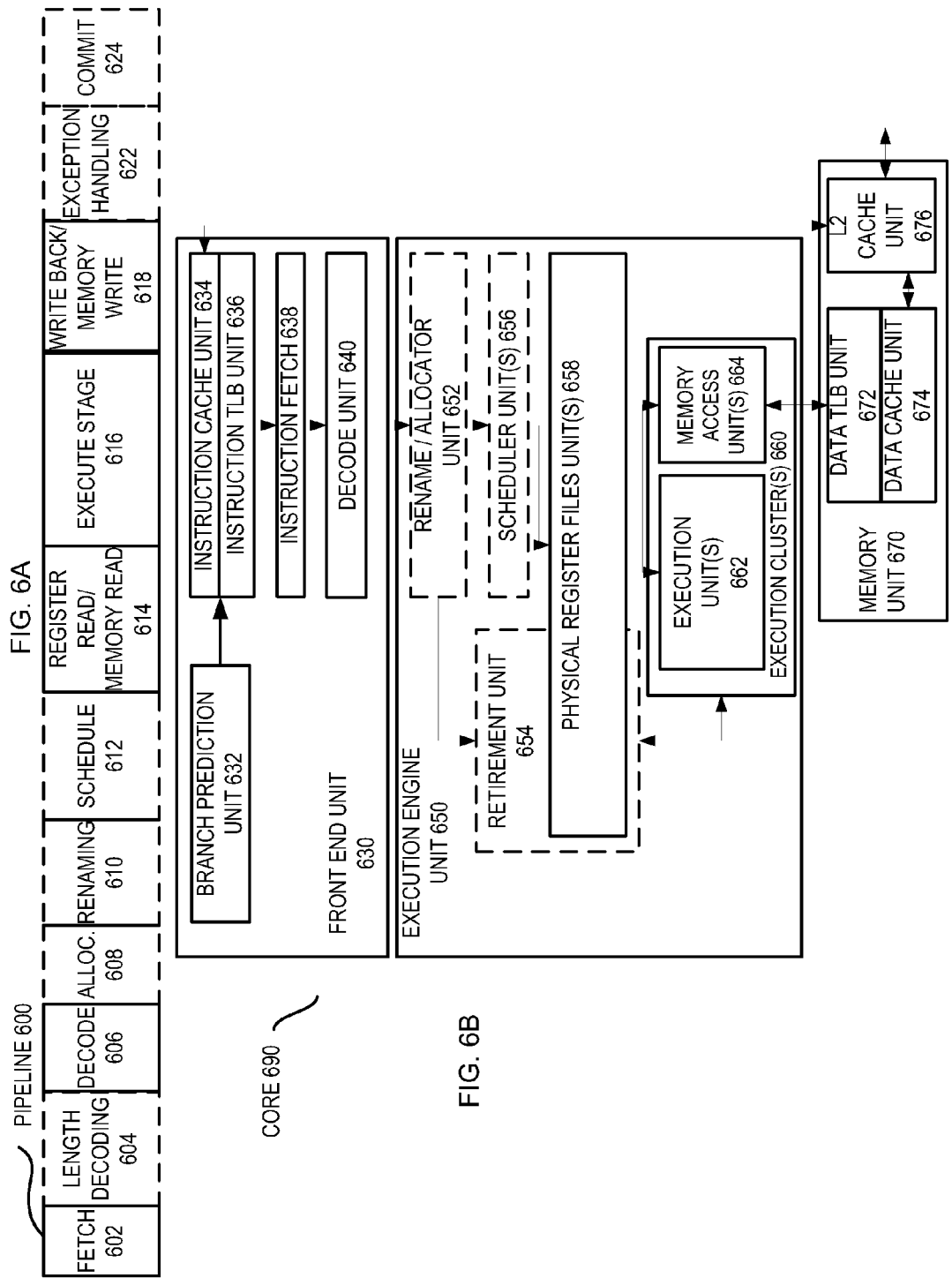

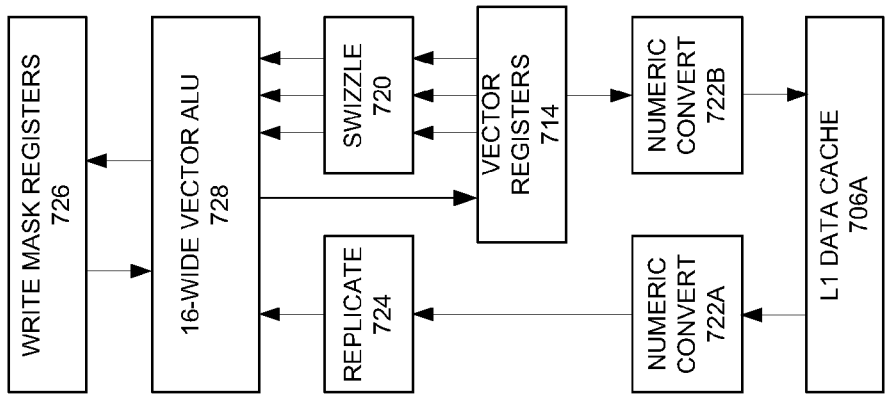
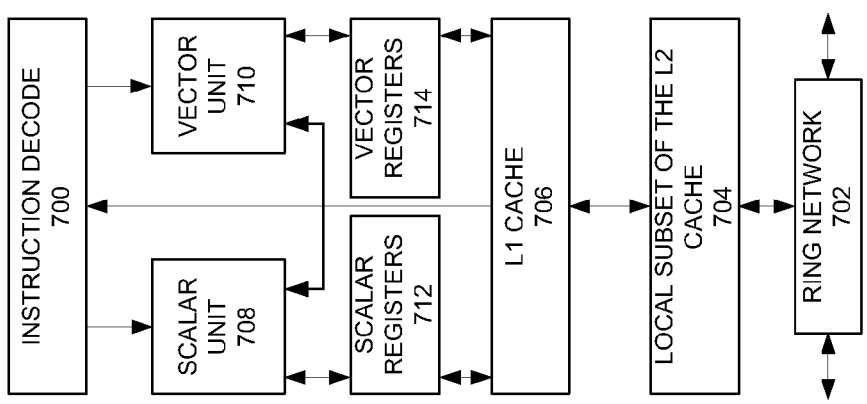

FAULT-AWARE MAPPING FOR SHARED LAST LEVEL CACHE (LLC)

CROSS-REFERENCE TO RELATED APPLICATION

This patent application is a U.S. National Phase Application under 35 U.S.C. §371 of International Application No. PCT/US2011/066953, filed Dec. 22, 2011, entitled FAULT-AWARE MAPPING FOR SHARED LAST LEVEL CACHE (LLC).

FIELD OF INVENTION

The field of invention relates generally to computer processor architecture, and, more specifically, to cache memory.

BACKGROUND

As integrated circuit technology continues to scale down to smaller geometries, the supply voltages are also being lowered to reduce power consumption. Although lowering the supply voltages helps to reduce power consumption, lowering the supply voltages may have the unintended consequence of increasing leakage. Memory circuits such as SRAM and SRAM-based components such as cache memories are typically more susceptible to erroneous operation resulting from leakage than other logic circuits. Because of this, as the supply voltages are lowered for integrated circuit devices that include SRAM-based components, for example, a microprocessor with cache memories, the SRAM-based components typically fail at a higher voltage level than the rest of the device. As such, the minimum voltage required to operate the SRAM-based components reliably tends to be the limiting factor on how low the supply voltage can be lowered. This effect is also referred to as the "Vccmin effect."

Across different manufacturing process variations, a certain percentage of integrated circuit devices are expected to fail due to defects and/or device timing variations attributed to the manufacturing process. To ensure that defective devices are not sold or used in the field, reliability testing is typically performed at the manufacturing stage to determine if a particular device can operate reliably over a target range of operating conditions. If the particular device fails the reliability testing, the entire device is discarded. As the supply voltages are being lowered to reduce power consumption, in addition to the defective devices resulting from manufacturing process variation, an additional percentage of devices are expected to fail reliability testing due to the Vccmin effect described above. Hence, the lowering of supply voltages tends to have an adverse impact on the overall yield of the integrated circuit device. One way of mitigating this adverse impact for SRAM-based components is to implement error correction mechanisms such as Error Correcting Codes (ECC). However, implementing ECC comes at the cost of additional memory to store the ECC bits, a reduction in performance due to the additional time needed to perform the error correction operations, and an increase in power consumption associated with performing the error correction operations. Furthermore, the number of erroneous bits that can be corrected by ECC is limited.

BRIEF DESCRIPTION OF THE DRAWINGS

The present invention is illustrated by way of example and not limitation in the figures of the accompanying drawings, in which like references indicate similar elements and in which:

FIG. 6A illustrates a block diagram illustrating both an exemplary in-order pipeline and an exemplary register renaming, out-of-order issue/execution pipeline according to embodiments of the invention.

FIG. 6B illustrates a block diagram illustrating both an exemplary embodiment of an in-order architecture core and an exemplary register renaming, out-of-order issue/execution architecture core to be included in a processor according to embodiments of the invention FIG. 7A illustrates a block diagram of a single processor core, along with its connection to the on-die interconnect network and with its local subset of the Level 2 (L2) cache, according to embodiments of the invention.

FIG. 7B illustrates an expanded view of part of the processor core, according to embodiments of the invention.

DETAILED DESCRIPTION

Figure 1:
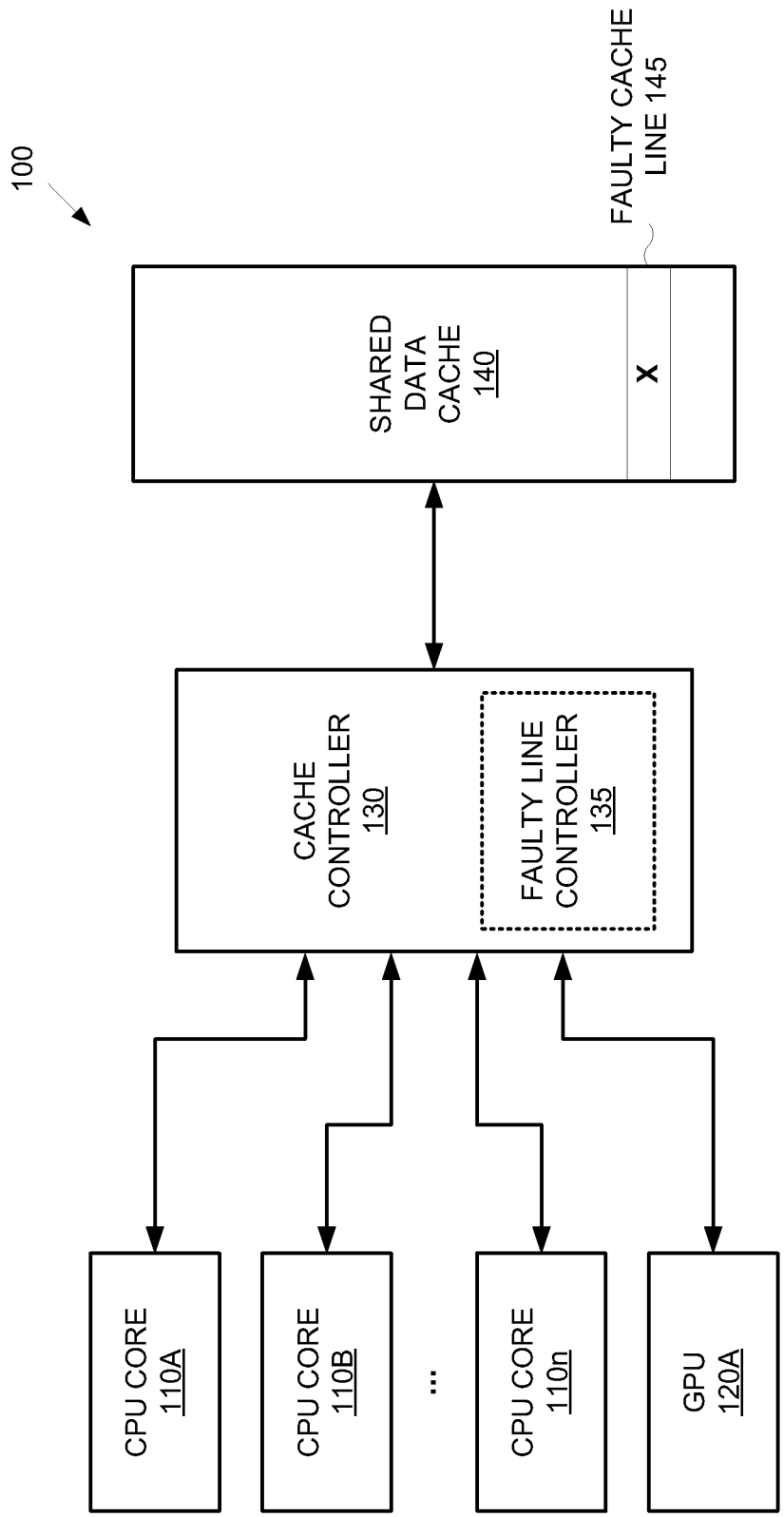
FIG. 1 illustrates a block diagram of a microprocessor, according to embodiments of the invention.

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein, a "faulty cache line" refers to a cache line that has a certain amount of erroneous memory locations that cannot be written or read correctly, while the rest of the cache line is functioning correctly. In some embodiments, the number of erroneous memory locations within a cache line can be less than 50% of the cache line, less than 40% of the cache line, or less than 30% of the cache line. Hence, in some embodiments, at least half of the faulty cache line is functioning correctly. In other embodiments, a higher percentage of erroneous memory locations within a faulty cache line can be tolerated.

Embodiments of the present invention disclose methods and apparatus for utilizing a faulty cache line in the cache during the normal operation of the cache. Devices with a faulty cache line due to manufacturing process variations or Vccmin effect are typically detected at the manufacturing stage during reliability testing and discarded. By being able to utilize a faulty cache line according to embodiments of the present invention, devices with one or more faulty cache lines can still be used during normal operation to prevent these devices from being discarded resulting in a higher manufacturing yield.

Furthermore, more aggressive power reduction techniques can be implemented to lower the supply voltages even further. This is because the Vccmin effect may no longer be the limiting factor on how low the supply voltages can be lowered, as faulty cache lines attributed to the Vccmin effect are acceptable and utilized for cache accesses during normal operation of the cache according to embodiments of the present invention. In prior power reduction techniques, the supply voltages were lowered until a component of a device, for example, a cache in the device, fails. In embodiments of the present invention, the supply voltages can be lowered until some other component besides the cache fails. Because a cache typically fails at a higher supply voltage than other components, the supply voltages according to embodiments of the present invention can be lowered beyond what was previously possible.

FIG. 1 illustrates a microprocessor 100 according to one embodiment of the present invention. The microprocessor includes at least one central processing unit (CPU) core 110A-110n and a graphics processing unit (GPU) 120A. In an exemplary embodiment, there can be two to six CPU cores 110 and one GPU 120. In other embodiments, there can be any number of CPU cores 120 and any number of GPUs 120. The CPU cores 110A-110n and GPU 120 are coupled to and has shared access to a shared data cache 140. The shared data cache 140 can be a last level cache (LLC), or a shared mid-level cache such as a shared level 2 (L2), level 3 (L3), level 4 (L4), or other levels of shared data cache and/or combinations thereof. The shared data cache 140 has a plurality of cache lines, and can be organized into cache sets. The shared data cache 140 may have one or more faulty cache lines 145. The faulty cache lines 145 may be faulty due to the Vccmin effect (i.e. operating the shared data cache 140 at a supply voltage level that is too low for the entire shared data cache 140 to operate reliably) and/or defects and device timing variations attributed to manufacturing process variations.

The microprocessor 100 further includes a cache controller 130 coupled between the shared data cache 140 and the CPU cores 110A-110n and GPU 120 to handle cache accesses to the shared data cache 140. The cache controller 130 augments the cache accesses by employing an address mapping mechanism that devotes faulty cache lines 145 to cache accesses from the GPU 120. The address mapping decision performed by the address mapping mechanism is based on the fault tolerance of the data of a particular cache access and the status of the cache line that is being requested. More specifically, the address mapping mechanism takes into account the source of a cache access request (i.e. from one of the CPU cores 110A-110n or from GPU 120) and whether the cache line being requested is a faulty cache line 145. The cache controller 130 includes a faulty line controller 135 to determine which of the cache lines in shared data cache 140 is a faulty cache line 145.

GPU 120 mostly performs calculations related to multimedia applications, such as computer graphics and video encoding, while CPU cores 110A-110n perform more varied and traditional computations. Errors in multimedia data typically do not cause programs to crash. Instead, errors in multimedia data typically produce wrong pixels in a video frame or a lower image quality, and do not affect program execution. Hence, multimedia data used by GPU 120 is more fault tolerable than data used by CPU cores 110A-110n. Thus, errors introduces by a faulty cache line 145 in the multimedia data used by GPU 120 may be acceptable during normal operation of the microprocessor 100.

The address mapping mechanism according to embodiments of the present invention devotes faulty cache lines 145 of the shared data cache 140 to cache accesses of multimedia data from GPU 120, and ensures fault-free cache lines are used for cache accesses from the CPU cores 110A-110n. However, this does not mean that GPU 120 is only allowed to access the faulty cache lines 145. This just means that if a faulty cache line 145 is selected to be accessed by GPU 120, the cache access request to the faulty cache line 145 by GPU 120 is allowed to proceed. If a fault-free cache line is selected to be accessed by GPU 120, the cache access request to the fault-free cache line by GPU 120 is also allowed to proceed. Hence, when GPU 120 attempts to access any of the cache lines in shared data cache 140, the attempt to access a particular cache line is allowed to proceed whether the particular cache line is a faulty cache line 145 or a fault-free cache line. Contrarily, if a faulty cache line 145 is selected to be accessed by one of the CPU cores 110A-110n, the request to access the faulty cache line 145 by one of the CPU cores 110A-110n is remapped by the cache controller 130 to access a fault-free cache line instead. If a fault-free cache line is selected to be accessed by one of the CPU cores 110A-110n, the cache access request to the fault-free cache line by one of the CPU cores 110A-110n is also allowed to proceed. Hence, when one of the CPU cores 110A-110n attempts to access a faulty cache line 145 in shared data cache 140, the cache controller 130 redirects that CPU core to access a fault-free cache line.

Figure 4A:
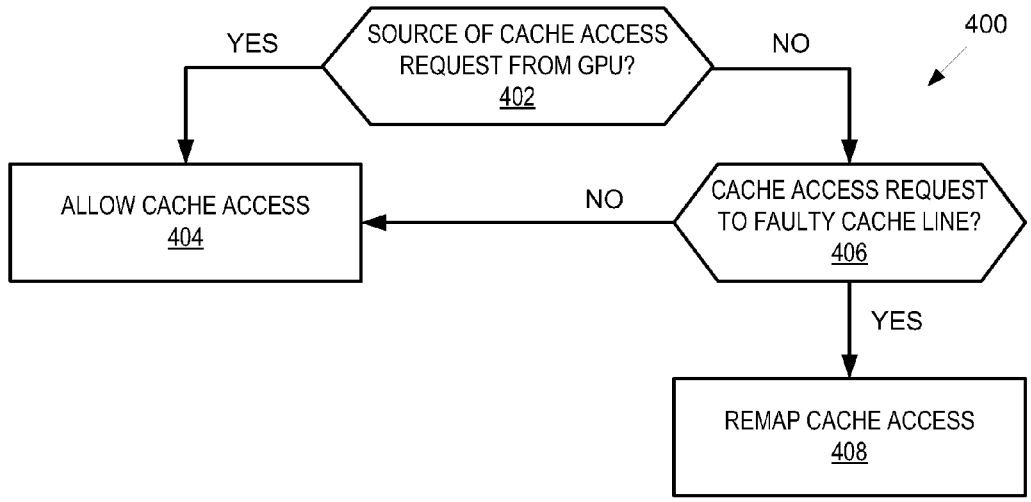
FIG. 4A illustrates a method for utilizing a faulty cache line, according to one embodiment of the invention.

FIG. 4A illustrates a method for utilizing a faulty cache line 145 in a shared data cache 140, for example, a last level cache (LLC) of a microprocessor 100, according to embodiments of the present invention. When the cache controller 130 detects a cache access request to the shared data cache 140, at block 402, the cache controller 130 determines if the source of the cache access request is from GPU 120 or from one of the CPU cores 110A-110n. The source of a cache access request can be determined by checking the source ID of the cache access request provided by a global queue, an active directory, or other mechanisms employed by the microprocessor 100 that marks the owner of a cache access request. If the source of the cache access request is determined to be from GPU 120, then at block 404, the cache controller 130 allows the GPU 120 to perform the cache access even if the cache access request is to a faulty cache line 145 in the shared data cache 140. In other words, cache access requests from GPU 120 are allowed to proceed regardless of whether the cache access request is to a faulty cache line 145 or to a fault-free cache line.

If the source of the cache access request is determined to be from one of the CPU cores 110A-110n, then at block 406, the cache controller 130 determines if the cache access request from the particular CPU core is to a faulty cache line 145. If it is determined that the cache access request form the particular CPU core is not to a faulty cache line 145, then at block 404, the cache access request is allowed to proceed. If it is determined that the cache access request form the particular CPU core is to a faulty cache line 145, then at block 408, the cache access request is remapped to redirect the particular CPU core to access a fault-free cache line instead. In other words, in embodiments of the present invention, for cache access requests that from one of the CPU cores 110A-110n, only those of the cache access requests that are directed to a fault-free cache line is allowed to proceed.

Figure 2:
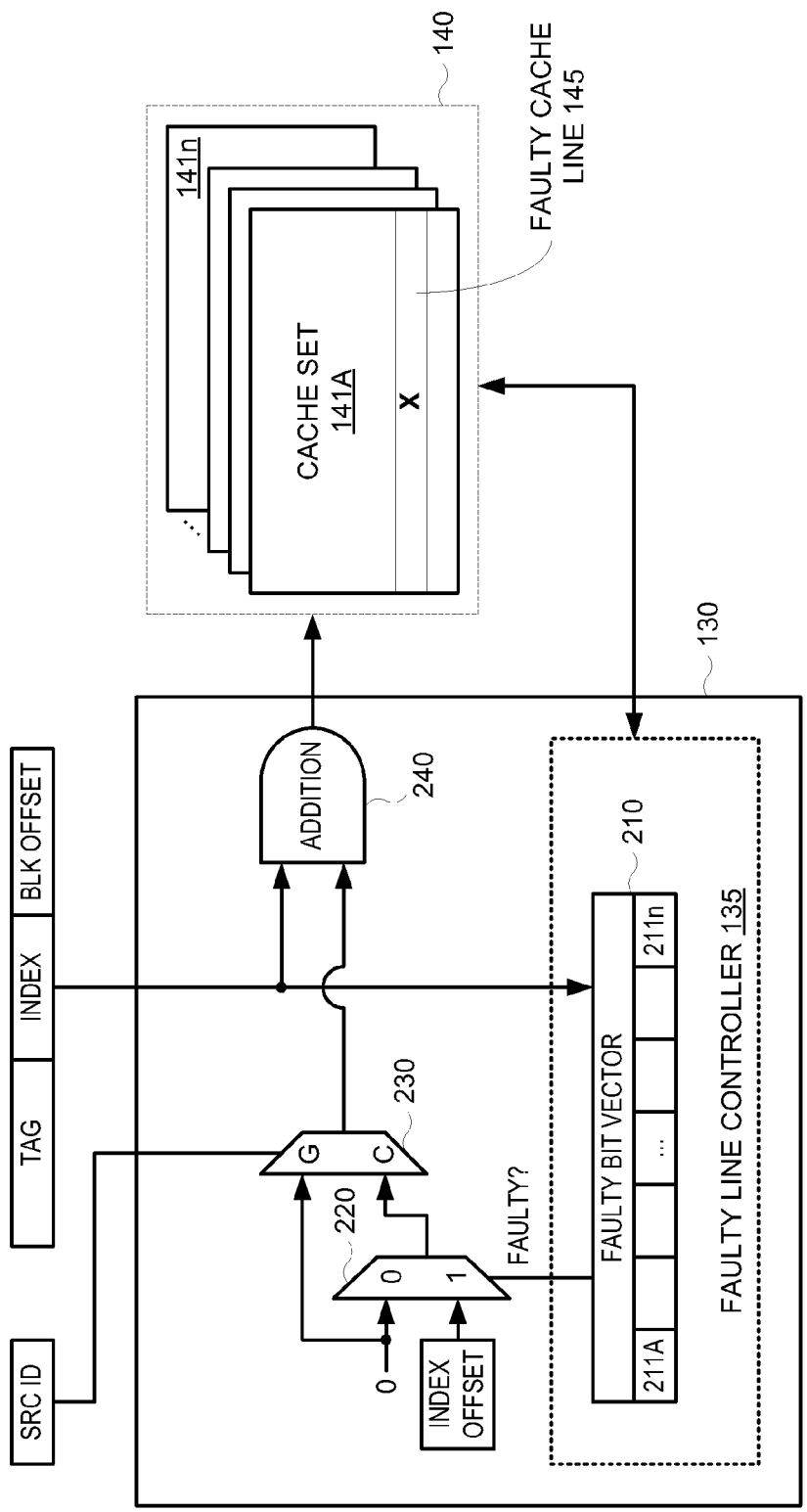
FIG. 2 illustrates a conceptual block diagram of a cache access, according to one embodiment of the invention.

FIG. 2 illustrates a conceptual block diagram of a cache access according to one implementation of the method 400 in an exemplary embodiment of the present invention. In this exemplary embodiment, a faulty bit vector 210 is used to remap cache access requests to a faulty cache line 145 from one of the CPU cores 110A-110n to access a fault-free cache line instead. As mentioned previously, the shared data cache 140 can be organized into cache sets 141A-141n as shown in FIG. 2. The faulty bit vector 210 has the same number of entries 211A-211n as the number of cache sets 141A-141n. In other words, each one of the entries 211A-211n corresponds to one of the cache sets 141A-141n. For each of the cache sets 141A-141n that has one or more faulty cache lines 145, the corresponding one of the entries 211A-211n in the faulty bit vector 210 is set to a "1" by the faulty line controller 135. For the rest of the cache sets that do not include any faulty cache lines 145, the corresponding one of the entries 211A-211n in the faulty bit vector 210 is set to a "0" by the faulty line controller 135.

The faulty cache lines 145 in the shared data cache 140 can be marked at the manufacturing stage during reliability testing to allow the faulty line controller 135 to identify which of the cache lines is faulty. Alternatively, the faulty cache lines 145 can be determined to be faulty dynamically in the field. Testing each cache line dynamically in the field has the advantage that some faults may be intermittent and may only occur at certain operating conditions. These operating conditions may not have been covered during reliability testing at the manufacturing stage. For example, reliability testing is typically performed at a minimum operating temperature, room temperature, and a maximum operating temperature. Other intermediate operating temperatures that may be encountered in the field may not have been tested during reliability testing at the manufacturing stage. Hence, it may be possible that faults that only occur at these intermediate temperatures could have escaped detection during reliability testing, and dynamic in-field testing provides additional coverage to detect such faults.

To test each cache line for errors to determine which of the cache lines are faulty cache lines 145, a built-in self test (BIST) or a power-on self test (POST) can be performed. A built-in self test is performed by putting the shared data cache 140 into a test mode and to write and read back a series of test patterns to each cache line. If the values read back from each cache line matches the values written to that cache line for all the test patterns in the series, then the cache line is determined to be a fault-free cache line. If the values read back mismatch the values written for any of the test patterns, then the cache line is determined to be a faulty cache line 145. A POST performs similar operations of writing and reading back a series of test patterns to each cache line. A POST differs from a BIST in that a POST is performed automatically at each power-up and/or reset of the shared data cache 140. Either a BIST and/or a POST can be performed as part of reliability testing at the manufacturing stage or dynamically in the field.

Once the faulty cache lines 145 in the shared data cache 140 are determined by performing a BIST or POST at the manufacturing stage or dynamically in the field, the cache sets 141A-141n that have one or more faulty cache lines 145 can be identified, and the faulty bit vector 210 can be set accordingly by the faulty line controller 135. When one of the CPU cores 110A-110n or GPU 120 issues a cache access request, an address corresponding to the cache access request is given to the cache controller 130. The address can be separated into a tag portion, an index portion, and a block offset portion. In one embodiment, the index portion is used to index into a particular cache set, and the tag portion of the address is compared to the tags in the particular indexed cache set to determine if there is a cache hit. The block offset portion is used to identify which data block within a cache line should be accessed upon a cache hit.

A cache access request may potentially access a faulty cache line 145 if the cache access request is to a cache set that has one or more faulty cache lines 145. In order to check if the cache access request is to such a cache set that has one or more of the faulty cache lines 145, the index portion of the address is used as an index into the faulty bit vector 210 to identify which of the entries 211A-211n of the faulty bit vector 210 corresponds to the cache set that is being requested. The value of the identified entry in the faulty bit vector 210 is used to determine whether an index offset is added to the index portion of the address of the cache access request. If the identified entry in the faulty bit vector 210 has a value of "1," then the cache set being requested has one or more faulty cache lines 145, and an index offset is added to the index portion of the address if the cache access request is determined to be from one of the CPU cores 110A-110n. If the identified entry in the faulty bit vector 210 has a value of "0," then the cache set indicated by the index portion of the address has only fault-free cache lines, and the index portion of the address is unmodified to allow the cache access request to proceed.

In one exemplary embodiment as shown in FIG. 2, a multiplexer 220 and a multiplexer 230 are coupled together to select whether an index offset is added to the index portion of the address. The addition operation is performed by an addition circuit 240. The value of the identified entry in the faulty bit vector 210 is used as an input select for multiplexer 220 to select between an index offset and the value "0." The source as indicated by the source ID of the cache access request provided by a global queue, an active directory, or other mechanisms employed by the microprocessor 100 that marks the owner of a cache access request is used as an input select into multiplexer 230 to select between the output of multiplexer 220 or the value "0." If the value of the identified entry in the faulty bit vector 210 is a "0," then both inputs to multiplexer 230 would also be "0," and regardless of whether the source of the cache access request is from one of the CPU cores 110A-110n or from GPU 120, the output of multiplexer 230 would be "0." In this case, the addition circuit 240 would add "0" to the index portion of the address. The index portion of the address would remain unchanged, and the cache access request is allowed to proceed to access its original target cache set.

If the value of the identified entry in the faulty bit vector 210 is a "1," then the lower input into multiplexer 230 would be an index offset. If the source ID of the cache access request indicates the cache access is from GPU 120, then the output of multiplexer 230 would be a "0." In this case, the addition circuit 240 would add "0" to the index portion of the address.

The index portion of the address would remain unchanged, and the cache access request is allowed to proceed to access its original target cache set even if the target cache set has one or more faulty cache line 145, because the source of this particular cache access request is from GPU 120.

If the value of the identified entry in the faulty bit vector 210 is a "1," and the source ID of the cache access request indicates the cache access request is from one of the CPU cores 110A-110n, then the output of multiplexer 230 would be the index offset. In this case, the addition circuit 240 would add the index offset to the index portion of the address. The resulting modified index (i.e. the sum of the index offset and the index portion of the address) is then used as an index to select which of the cache sets 141A-141n is accessed. Hence, the index offset is used to remap the cache access request to redirect the particular CPU core to access a different cache set than the original target cache set.

The index offset can have an arbitrary value, for example, a value of "1," in which case, a cache access request to a cache set with a faulty cache line 145 from one of the CPU cores 110A-110n is always remapped to the access the next cache set. In other embodiments, other values can be used for the index offset. Furthermore, while the number of faulty cache lines 145 is expected to be small, it is possible that the cache access request may be remapped to access another cache set that may also have one or more faulty cache lines 145. To avoid accessing a faulty cache line in such a scenario, the index offset can be implemented as a counter as described below.

If a cache access request to a cache set with a faulty cache line 145 from one of the CPU cores 110A-110n is detected, the initial value of the counter is added to the index portion of the address, and the resulting modified index is checked against the faulty bit vector 210 to determine if the modified index points to another cache set with one or more faulty cache lines 145. If so, the counter is incremented, and the value of the updated counter is used as a new index offset. The value of the updated counter is then added to the original index portion of the address to remap the cache access to a different cache set. The process continues until the cache access request is remapped to a cache set with no faulty cache lines. Once a cache access request is successfully remapped to a cache set with no faulty cache lines, the counter is reset to its initial value. This allows the remapping mechanism to be consistent across multiple cache accesses. Because the number of faulty cache lines 145 is expected to be small, the latency resulting from this recursive process is also expected to be small, and the impact to the performance of the cache 140 is expected to be minimal.

It should be noted that although the exemplar embodiment as shown in FIG. 2 uses an addition circuit 240 to add an index offset to the index portion of the address, in other embodiments, other logical operations can be performed on the index portion of the address to remap a cache access request. For example, a simpler shift register can be used instead of an addition circuit. The index offset can be used to indicate the number of bits to right-shift or left-shift the index portion of the address. The index portion of the address can be offset to remap a cache access request in any number of ways, as long as cache access requests from the same source having the same index portion of the address are consistently remapped to the access the same cache set.

It should also be noted that while the shared data cache 140 has been described above as being organized into cache sets 141A-141n, in other embodiments, the shared data cache 140 may have a flat architecture. In these embodiments, the index portion of the address may be used to index directly into a single cache line of the shared data cache 140. A faulty bit vector 210 can still be used to remap cache access requests to a faulty cache line 145 from one of the CPU cores 110A-110n to redirect the particular CPU core to access a fault-free cache line instead. In these embodiments, the faulty bit vector 210 would have one entry for each cache line in the shared data cache 140. The operations of remapping a cache access request is the same as those described above.

Figure 4B:
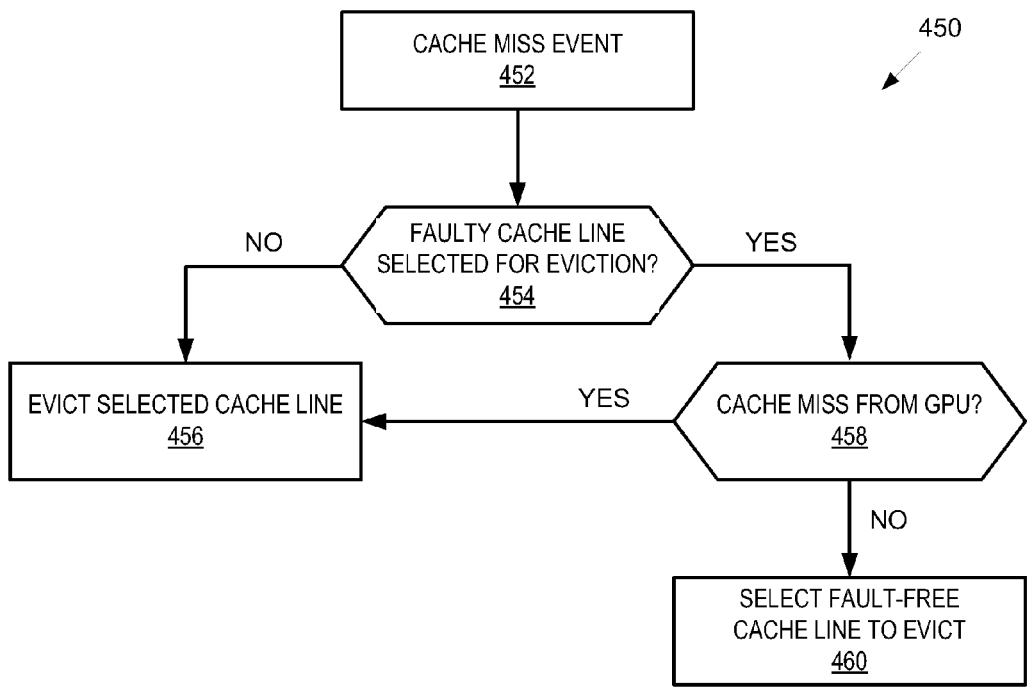
FIG. 4B illustrates a method for utilizing a faulty cache line, according to a different embodiment of the invention.

FIG. 4B illustrates a method 450 for utilizing a faulty cache line 145 in a shared data cache 140, for example, a last level cache (LLC) of a microprocessor 100, according to a different embodiment of the present invention. In this embodiment, instead of remapping a cache access request, the cache replacement policy of the cache controller 130 is used to devote faulty cache lines 145 to GPU 120. At block 452, the cache controller 130 detects a cache miss event. In response to detecting a cache miss event, the cache controller 130 determines, at block 454, if a faulty cache line 145 is selected for eviction based on the cache replacement policy of the cache controller 130. If it is determined that a fault-free cache line is selected for eviction based on the cache replacement policy of the cache controller 130, then at block 456, the fault-free cache line that is selected for eviction is evicted and replaced.

If it is determined, at block 454, that a faulty cache line 145 is selected for eviction based on the cache replacement policy of the cache controller 130, then at block 458, it is determined if the cache miss event resulted from a cache access by GPU 120. If the cache miss event resulted from a cache access by GPU 120, then at block 456, the faulty cache line 145 that is selected for eviction is evicted and replaced. In other words, if a cache miss event resulted from a cache access by GPU 120, then the cache replacement policy used by the cache controller 130 is not modified, and the cache line selected by the cache replacement policy for eviction is evicted and replaced. If the cache miss event resulted from a cache access by one of the CPU cores 110A-110n, and a faulty cache line 145 is selected for eviction, then at block 460, the cache controller 130 evicts a fault-free cache line instead of the selected faulty cache line 145.

In one exemplary embodiment, the cache replacement policy of the cache controller 130 may select a cache line for eviction based on a least-recently-used (LRU) replacement policy. If a cache miss event resulted from a cache access from GPU 120, then the least-recently used cache line (including any faulty cache lines 145) is evicted. If a cache miss event resulted from a cache access from one of the CPU cores 110A-110n, then the cache controller 130 skips any faulty cache lines 145 even if they are one of the least-recently used cache lines, and evicts the next fault-free cache line in the same cache set instead. In other embodiments, a most-recently-used (MRU) replacement policy, a first-in-first-out (FIFO) replacement policy, a last-in-first-out (LIFO) replacement policy, a random replacement policy, or other cache replacement policies may be used to select a cache line for eviction upon a cache miss event.

Figure 3:
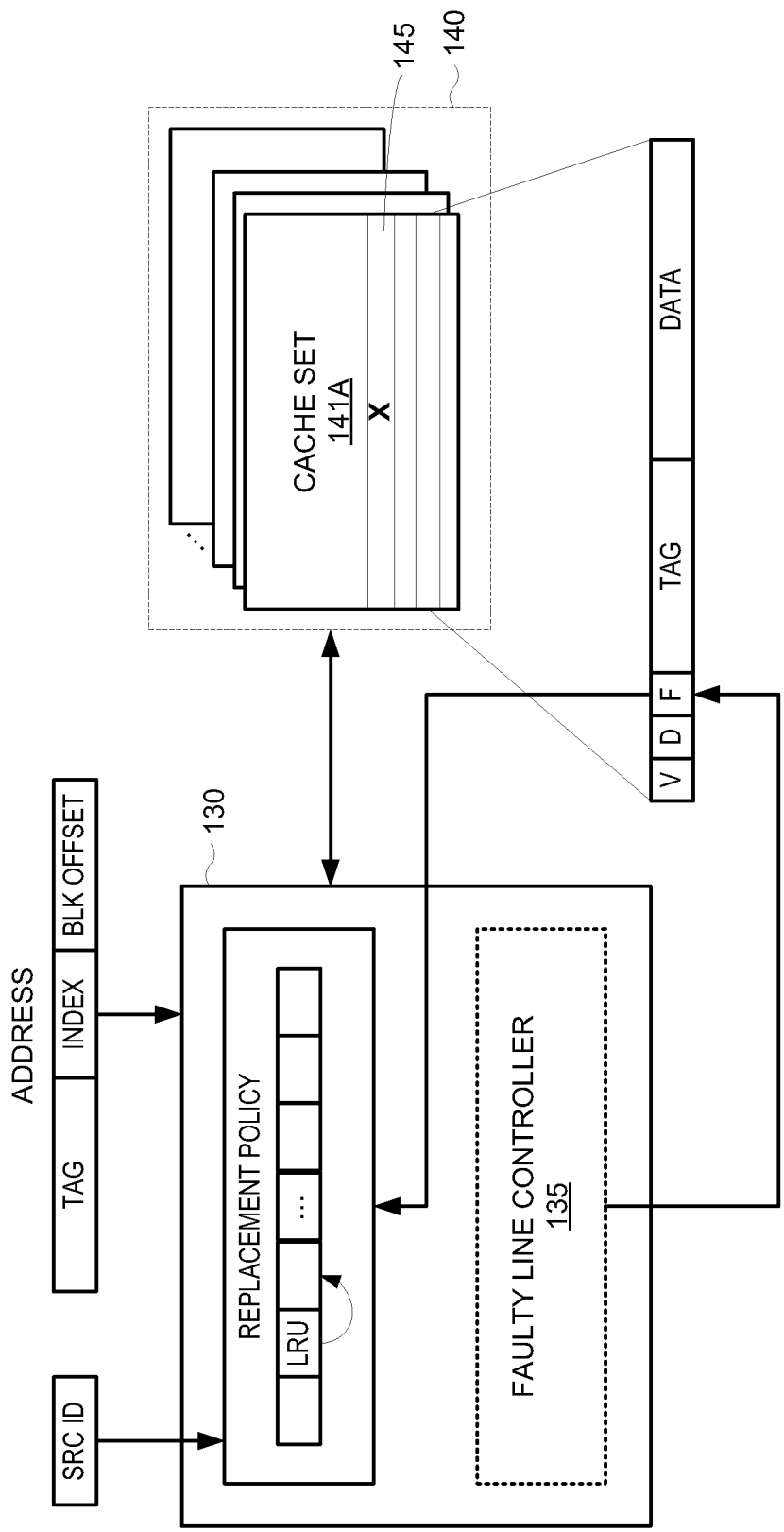
FIG. 3 illustrates a conceptual block diagram of a cache replacement policy, according to one embodiment of the invention.

FIG. 3 illustrates a conceptual block diagram of a cache replacement policy according to one implementation of the method 450 in an exemplary embodiment of the present invention. In this exemplary embodiment, the status bits of each cache line are extended by a faulty status bit ("F" bit) to indicate whether a particular cache line is faulty. Hence, a faulty cache line 145 that has its faulty status bit set can be used to indicate to the cache controller 130 that the faulty cache line 145 is faulty. Other status bits that are associated with each cache line may include a valid bit ("V" bit) to indicate that the cache line contains valid data, and a dirty bit ("D" bit) to indicate that the data in the cache line has previously been overwritten and needs to be updated to the main memory. The faulty bit of each cache line can be set dynamically in the field by the faulty line controller 135 by performing a BIST or POST test on each cache line as described above to identify which of the cache lines is a faulty cache line 145. However, any time a faulty bit of a cache line is changed, the cache line should be invalidated by clearing the valid bit to avoid data inconsistencies.

In the case of a LRU replacement policy, in one embodiment, the cache controller 130 keeps track of the age of each cache line by using age bits. Every time a cache line is accessed, the age of the cache line being accessed is reset to "0," and the aged of all other cache lines are incremented. When a cache miss occurs, the cache line with the highest age is marked as the least-recently used cache line and is selected for eviction. Embodiments of the present invention augments the cache replacement policy used by the cache controller 130 by determining if the selected cache line is a faulty cache line 145 by checking if the faulty status bit of the cache line selected for eviction is set. If the faulty status bit of the cache line selected for eviction is set, then the cache controller 130 checks the source ID of the cache access that resulted in the cache miss event. If the source ID indicates that the cache miss resulted from a cache access from one of the CPU cores 110A-110$n$, then the cache controller 130 augments the cache replacement policy to skip the selected faulty cache line and selects the next fault-free cache line for eviction. If a cache access from GPU 120 resulted in the cache miss, or if the selected cache line is a fault-free cache line as indicated by the faulty status bit of the selected cache line, then the cache controller 130 allows the faulty cache line to be evicted. In embodiments that use other cache replacement policies, the same faulty status bit mechanism can be used to determine if a cache line selected for eviction should be evicted based on whether the cache line selected for eviction is a faulty cache line 145, and if the cache miss event leading to the eviction resulted from a cache access from one of the CPU cores 110A-110$n$ or from GPU 120.

In a further aspect of the present invention, one or more supply voltages of a microprocessor 100 can be intentionally lowered dynamically in order to aggressively reduce the power consumption of the microprocessor 100 to a level that induces a small percentage of faulty cache lines 145 in the shared data cache 140 without causing errors in other portions of the microprocessor 100. For example, if a microprocessor is used in a mobile product and the energy stored in the battery of the mobile product is below a certain low threshold level, lowering the supply voltages to induce faulty cache lines 145 in the shared data cache 140 may help to conserve power in the battery to allow the mobile product to operate longer before requiring the battery to be recharged. In some embodiments, the percentage of faulty cache lines 145 caused by intentionally lowering the supply voltages may be less than 30% of the cache lines in shared cache 140, less than 20% of the cache lines in shared cache 140, or less than 10% of the cache lines in shared cache 140. In other embodiments, other percentages of faulty cache lines may be tolerated.

Although lowering the supply voltages in this manner intentionally causes cache lines to become faulty, faulty cache lines 145 can be detected dynamically using the techniques described in the above. Cache accesses to these faulty cache lines 145 can be devoted to cache accesses of multimedia data from GPU 120 to allow the microprocessor to operate normally according to the embodiments and implementations described above. In this manner, the induced faulty cache lines 145 do not affect cache accesses from CPU cores 110A-110$n$, and programs executing the in CPU cores 110A-110$n$ can continue to run. When the battery of a mobile product is below a low threshold level, this may be a viable option to sacrifice performance of multimedia applications, for example, image quality of a video playback, in order to conserve as much power as possible.

Figure 5:
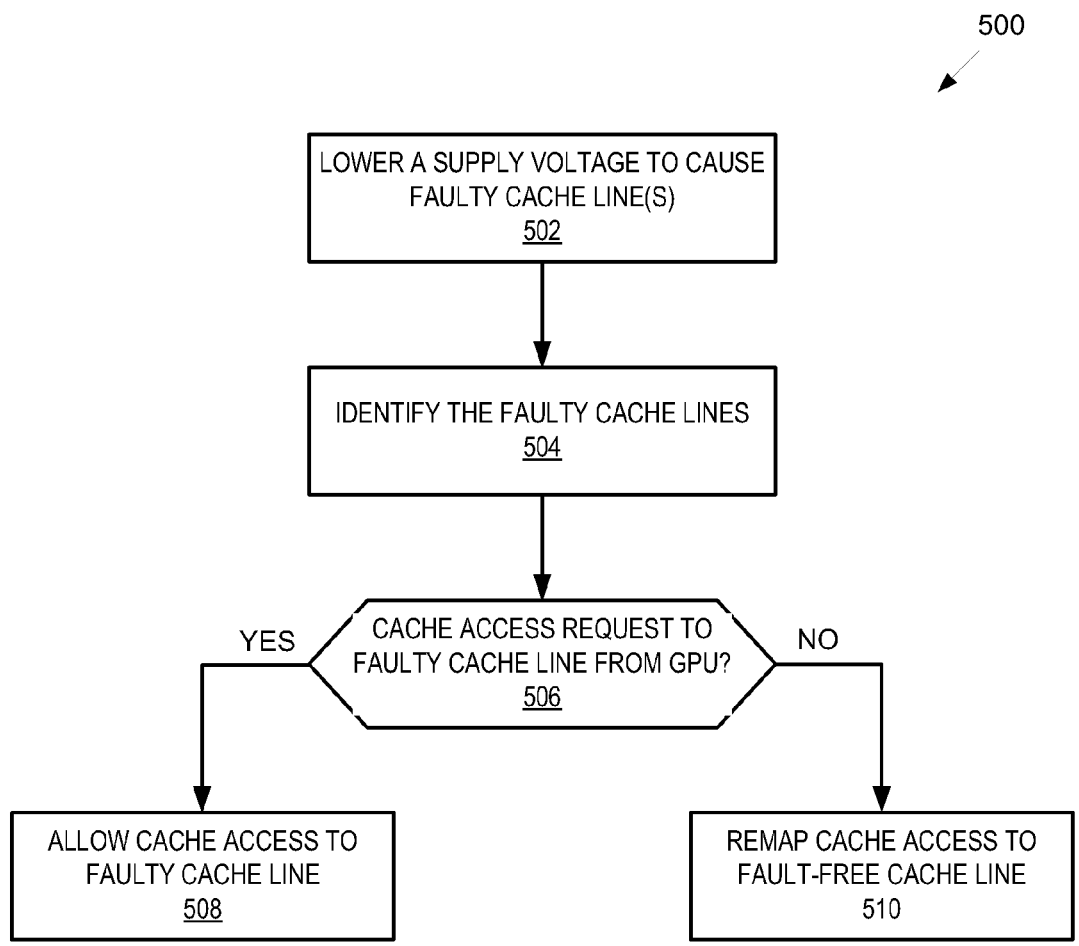
FIG. 5 illustrates a method for reducing a power consumption of a microprocessor, according to one embodiment of the invention.

FIG. 5 illustrates a method 500 for reducing a power consumption of a microprocessor 100 according to embodiments of the present invention. At block 502, one or more supply voltages to the microprocessor 100 is lowered to cause one or more cache lines in a shared data cache 140, for example, a last level cache (LLC), to become faulty during normal operation of the microprocessor 100. At block 504, a faulty line controller 135 dynamically identifies which of the cache lines in the shared data cache 140 is a faulty cache line 145. The faulty line controller 135 can identify which of the cache lines is a faulty cache line 145 by performing either a BIST or a POST as described above. The faulty line controller 135 can set a faulty status bit associated with each cache line to indicate whether that particular cache line is faulty. At block 506, a cache access request to a faulty cache line 145 is detected, and it is determined if the cache access request is from a GPU 120 of the microprocessor 100. For each cache access request detected that is requesting access to one of the faulty cache lines 145, the cache access request is allowed to proceed at block 508 if the cache access request is from GPU 120. If the cache access request is from one of the CPU cores 110A-110$n$, the cache access request is remapped to access a fault-free cache line instead.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS.

6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a write mask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 perform the execute stage 616; 6) the memory unit 670 and the physical register file(s) unit(s) 658 perform the write back/memory write stage 618; 7) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 634/674 and a shared L2 cache unit 676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

FIGS. 7A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 702 and with its local subset of the Level 2 (L2) cache 704, according to embodiments of the invention. In one embodiment, an instruction decoder 700 supports the x86 instruction set with a packed data instruction set extension. An L1 cache 706 allows low-latency accesses to cache memory into the scalar and vector units. While in one embodiment (to simplify the design), a scalar unit 708 and a vector unit 710 use separate register sets (respectively, scalar registers 712 and vector registers 714) and data transferred between them is written to memory and then read back in from a level 1 (L1) cache 706, alternative embodiments of the invention may use a different approach (e.g., use a single register set or include a communication path that allow data to be transferred between the two register files without being written and read back).

The local subset of the L2 cache 704 is part of a global L2 cache that is divided into separate local subsets, one per processor core. Each processor core has a direct access path to its own local subset of the L2 cache 704. Data read by a processor core is stored in its L2 cache subset 704 and can be accessed quickly, in parallel with other processor cores accessing their own local L2 cache subsets. Data written by a processor core is stored in its own L2 cache subset 704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an L1 data cache 706A part of the L1 cache 704, as well as more detail regarding the vector unit 710 and the vector registers 714. Specifically, the vector unit 710 is a 16-wide vector processing unit (VPU) (see the 16-wide ALU 728), which executes one or more of integer, single-precision float, and double-precision float instructions. The VPU supports swizzling the register inputs with swizzle unit 720, numeric conversion with numeric convert units 722A-B, and replication with replication unit 724 on the memory input. Write mask registers 726 allow predicating resulting vector writes.

Processor with Integrated Memory Controller and Graphics

Figure 8:
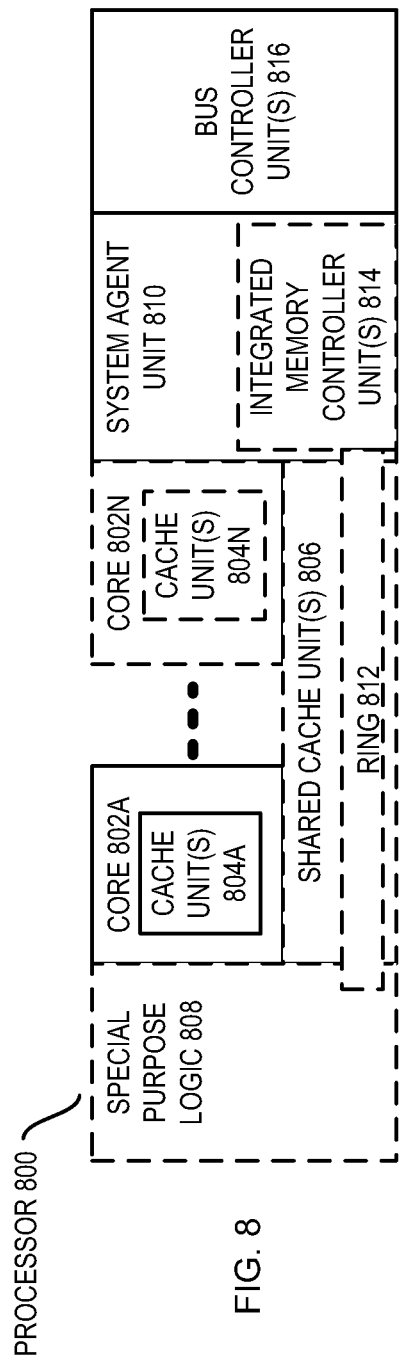
FIG. 8 illustrates a block diagram of a processor that may have more than one core, may have an integrated memory controller, and may have integrated graphics according to embodiments of the invention.

FIG. 8 is a block diagram of a processor 800 that may have more than one core, may have an integrated memory controller, and may have integrated graphics according to embodiments of the invention. The solid lined boxes in FIG. 8 illustrate a processor 800 with a single core 802A, a system agent 810, a set of one or more bus controller units 816, while the optional addition of the dashed lined boxes illustrates an alternative processor 800 with multiple cores 802A-N, a set of one or more integrated memory controller unit(s) 814 in the system agent unit 810, and special purpose logic 808.

Thus, different implementations of the processor 800 may include: 1) a CPU with the special purpose logic 808 being integrated graphics and/or scientific (throughput) logic (which may include one or more cores), and the cores 802A-N being one or more general purpose cores (e.g., general purpose in-order cores, general purpose out-of-order cores, a combination of the two); 2) a coprocessor with the cores 802A-N being a large number of special purpose cores intended primarily for graphics and/or scientific (throughput); and 3) a coprocessor with the cores 802A-N being a large number of general purpose in-order cores. Thus, the processor 800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 806, and external memory (not shown) coupled to the set of integrated memory controller units 814. The set of shared cache units 806 may include one or more mid-level caches, such as level 2 (L2), level 3 (L3), level 4 (L4), or other levels of cache, a last level cache (LLC), and/or combinations thereof. While in one embodiment a ring based interconnect unit 812 interconnects the integrated graphics logic 808, the set of shared cache units 806, and the system agent unit 810/integrated memory controller unit(s) 814, alternative embodiments may use any number of well-known techniques for interconnecting such units. In one embodiment, coherency is maintained between one or more cache units 806 and cores 802A-N.

In some embodiments, one or more of the cores 802A-N are capable of multi-threading. The system agent 810 includes those components coordinating and operating cores 802A-N. The system agent unit 810 may include for example a power control unit (PCU) and a display unit. The PCU may be or include logic and components needed for regulating the power state of the cores 802A-N and the integrated graphics logic 808. The display unit is for driving one or more externally connected displays.

The cores 802A-N may be homogenous or heterogeneous in terms of architecture instruction set; that is, two or more of the cores 802A-N may be capable of execution the same instruction set, while others may be capable of executing only a subset of that instruction set or a different instruction set.

Exemplary Computer Architectures

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
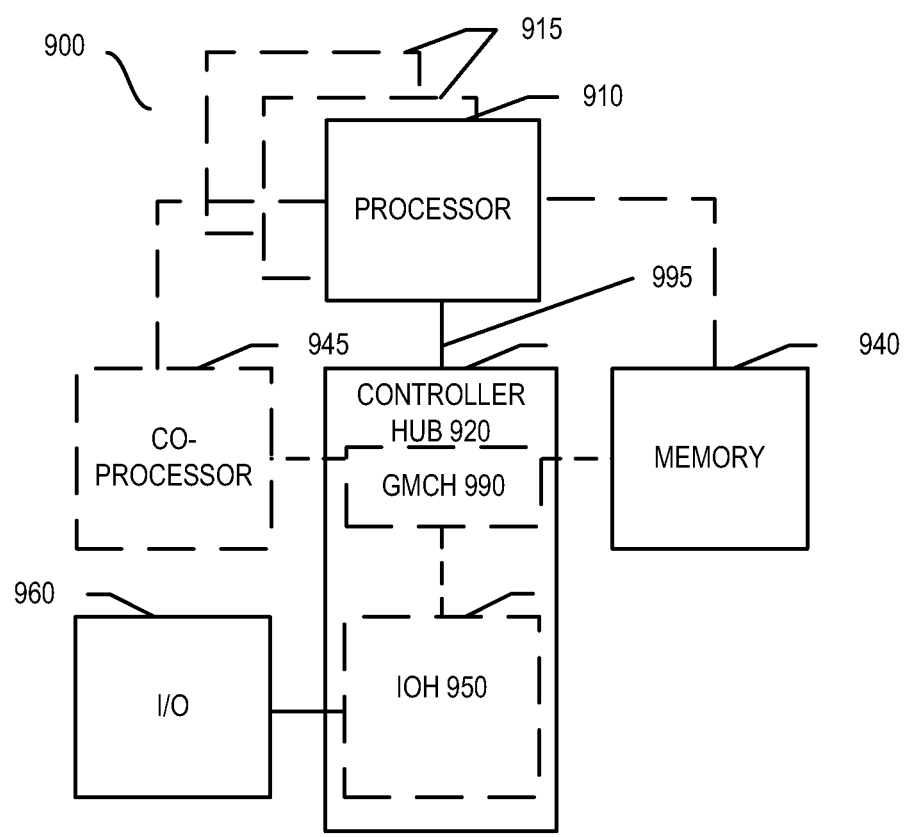
FIG. 9 illustrates a block diagram of a system in accordance with one embodiment of the present invention.

Referring now to FIG. 9, shown is a block diagram of a system 900 in accordance with one embodiment of the present invention. The system 900 may include one or more processors 910, 915, which are coupled to a controller hub 920. In one embodiment the controller hub 920 includes a graphics memory controller hub (GMCH) 990 and an Input/Output Hub (IOH) 950 (which may be on separate chips); the GMCH 990 includes memory and graphics controllers to which are coupled memory 940 and a coprocessor 945; the IOH 950 is couples input/output (I/O) devices 960 to the GMCH 990. Alternatively, one or both of the memory and graphics controllers are integrated within the processor (as described herein), the memory 940 and the coprocessor 945 are coupled directly to the processor 910, and the controller hub 920 in a single chip with the IOH 950.

The optional nature of additional processors 915 is denoted in FIG. 9 with broken lines. Each processor 910, 915 may include one or more of the processing cores described herein and may be some version of the processor 800.

The memory 940 may be, for example, dynamic random access memory (DRAM), phase change memory (PCM), or a combination of the two. For at least one embodiment, the controller hub 920 communicates with the processor(s) 910, 915 via a multi-drop bus, such as a frontside bus (FSB), point-to-point interface such as QuickPath Interconnect (QPI), or similar connection 995.

In one embodiment, the coprocessor 945 is a special-purpose processor, such as, for example, a high-throughput MIC processor, a network or communication processor, compression engine, graphics processor, GPGPU, embedded processor, or the like. In one embodiment, controller hub 920 may include an integrated graphics accelerator.

There can be a variety of differences between the physical resources 910, 915 in terms of a spectrum of metrics of merit including architectural, microarchitectural, thermal, power consumption characteristics, and the like.

In one embodiment, the processor 910 executes instructions that control data processing operations of a general type. Embedded within the instructions may be coprocessor instructions. The processor 910 recognizes these coprocessor instructions as being of a type that should be executed by the attached coprocessor 945. Accordingly, the processor 910 issues these coprocessor instructions (or control signals representing coprocessor instructions) on a coprocessor bus or other interconnect, to coprocessor 945. Coprocessor(s) 945 accept and execute the received coprocessor instructions.

Figure 10:
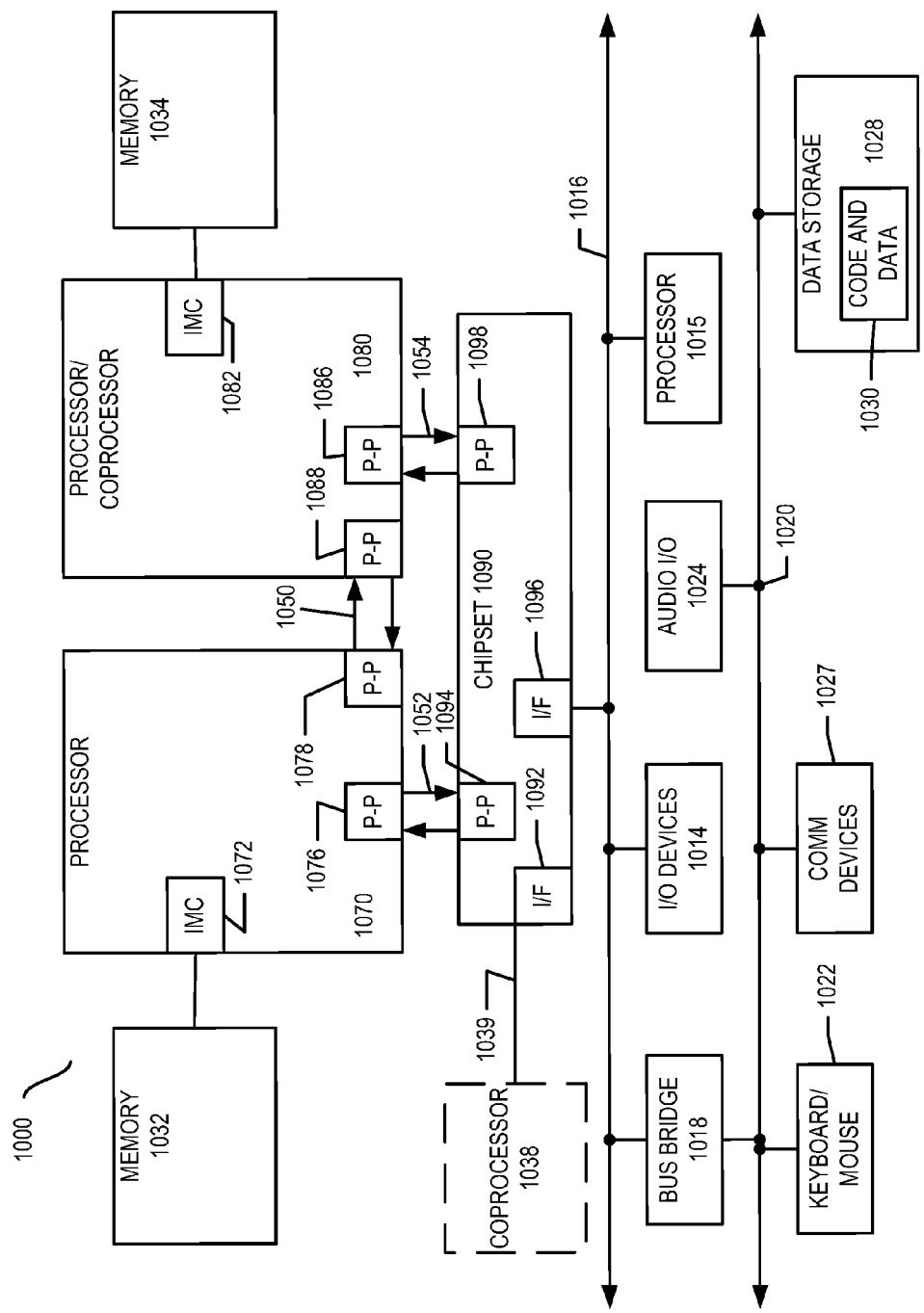
FIG. 10 illustrates a block diagram of a more specific exemplary system in accordance with an embodiment of the present invention

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 800. In one embodiment of the invention, processors 1070 and 1080 are respectively processors 910 and 915, while coprocessor 1038 is coprocessor 945. In another embodiment, processors 1070 and 1080 are respectively processor 910 coprocessor 945.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1039. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
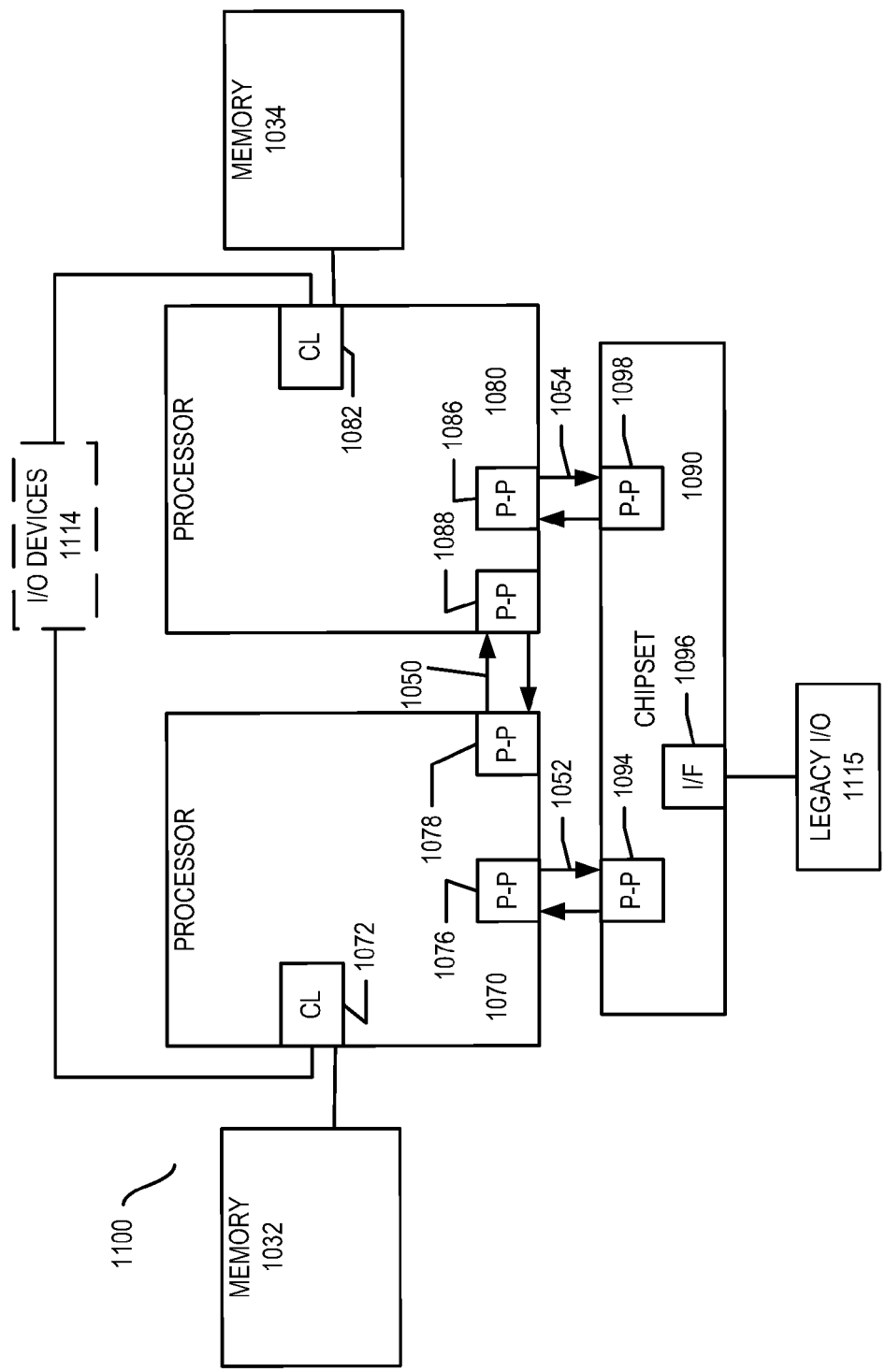
FIG. 11 illustrates a block diagram of another more specific exemplary system in accordance with an embodiment of the present invention

Referring now to FIG. 11, shown is a block diagram of a second more specific exemplary system 1100 in accordance with an embodiment of the present invention. Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1070, 1080 may include integrated memory and I/O control logic ("CL") 1072 and 1082, respectively. Thus, the CL 1072, 1082 include integrated memory controller units and include I/O control logic. FIG. 11 illustrates that not only are the memories 1032, 1034 coupled to the CL 1072, 1082, but also that I/O devices 1114 are also coupled to the control logic 1072, 1082. Legacy I/O devices 1115 are coupled to the chipset 1090.

Figure 12:
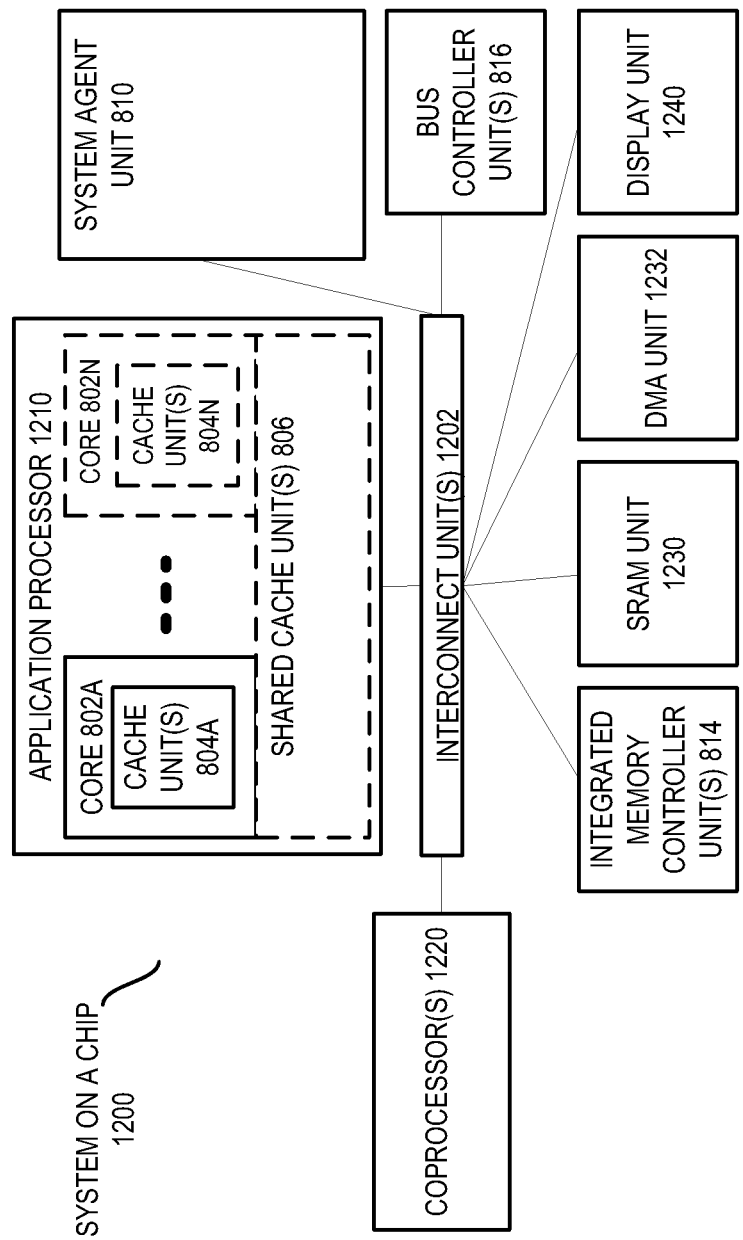
FIG. 12 illustrates a block diagram of a SoC in accordance with an embodiment of the present invention.

Referring now to FIG. 12, shown is a block diagram of a SoC 1200 in accordance with an embodiment of the present invention. Similar elements in FIG. 8 bear like reference numerals. Also, dashed lined boxes are optional features on more advanced SoCs. In FIG. 12, an interconnect unit(s) 1202 is coupled to: an application processor 1210 which includes a set of one or more cores 202A-N and shared cache unit(s) 806; a system agent unit 810; a bus controller unit(s) 816; an integrated memory controller unit(s) 814; a set or one or more coprocessors 1220 which may include integrated graphics logic, an image processor, an audio processor, and a video processor; an static random access memory (SRAM) unit 1230; a direct memory access (DMA) unit 1232; and a display unit 1240 for coupling to one or more external displays. In one embodiment, the coprocessor(s) 1220 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 13:
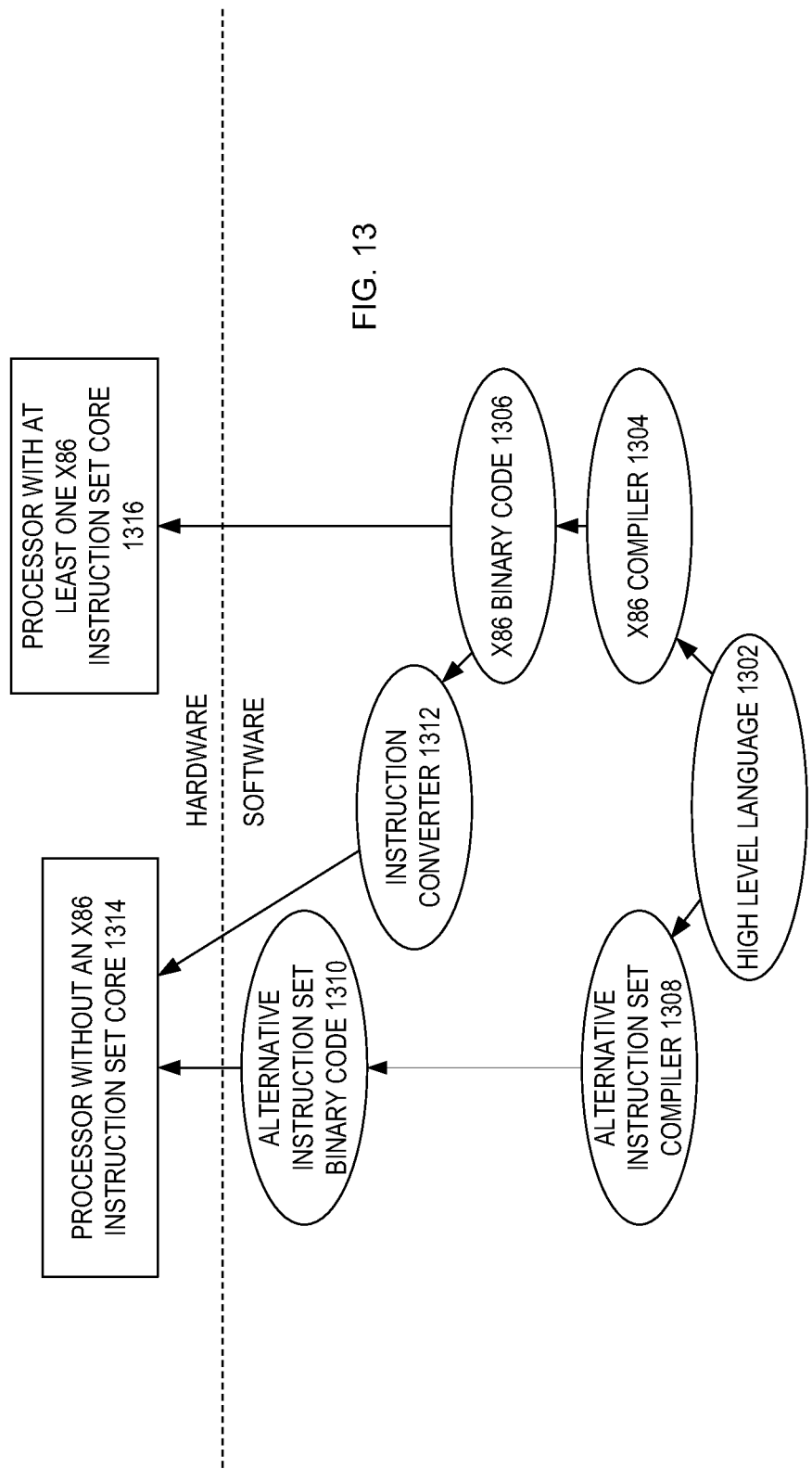
FIG. 13 illustrates a block diagram contrasting the use of a software instruction converter to convert binary instructions in a source instruction set to binary instructions in a target instruction set according to embodiments of the invention.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input data to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks (compact disk read-only memories (CD-ROMs), compact disk rewritables (CD-RWs)), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the invention also include non-transitory, tangible machine-readable media containing instructions the vector friendly instruction format or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents. For example, one or more operations of a method may be combined or further broken apart.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate embodiments of the invention. The scope of the invention is not to be determined by the specific examples provided above but only by the claims below.

What is claimed is:

1. An apparatus comprising:
a cache having a plurality of cache lines;
at least one central processing unit (CPU) core coupled to the cache; and
a graphics processing unit (GPU) coupled to the cache, wherein the GPU, and not the CPU, is allowed to access a faulty cache line in the cache and wherein a faulty cache line is a cache line that has an amount of erroneous memory locations that cannot be written or read correctly, while the rest of the cache line is functioning correctly.

2. The apparatus of claim 1, further comprises a cache controller, wherein the cache controller includes a faulty line controller coupled to the cache to identify which of the cache lines is the faulty cache line.

3. The apparatus of claim 2, wherein the cache controller is to redirect the CPU core to access a fault-free cache line when the CPU core attempts to access the faulty cache line.

4. The apparatus of claim 3, wherein the cache controller is to redirect the CPU core by adding an index offset to an index portion of an address when the CPU core attempts to access the faulty cache line.

5. The apparatus of claim 2, wherein the cache controller is to select a fault-free cache line for eviction when a cache access from the CPU core results in a cache miss.

6. The apparatus of claim 2, wherein the cache controller allows the faulty cache line to be evicted if a cache access from the GPU results in a cache miss.

7. The apparatus of claim 1, wherein each of the cache lines includes a faulty status bit to indicate whether that cache line is faulty.

8. The apparatus of claim 1, wherein the faulty cache line is determined to be faulty by performing one of a built-in self test (BIST) or a power-on self test (POST).

9. The apparatus of claim 1, wherein the cache is a last level cache.

10. A method for utilizing a faulty cache line in a cache, the method comprising:
determining, by a cache controller, that a source of a first cache access request is from a graphics processing unit (GPU); and
allowing the GPU to access the cache according to the first cache access request even if the first cache access request is requesting access to the faulty cache line, wherein a faulty cache line is a cache line that has an amount of erroneous memory locations that cannot be written or read correctly, while the rest of the cache line is functioning correctly.

11. The method of claim 10, further comprising:
   determining, by the cache controller, that the source of a second cache access request is from a central processing unit (CPU) core;
   determining if the second cache access request from the CPU core is requesting access to the faulty cache line; and
   remapping the second cache access request to access a fault-free cache line if the second cache access request from the CPU core is requesting access to the faulty cache line.

12. The method of claim 11, wherein the step of remapping comprises adding an index offset to an index portion of an address given by the second cache access request from the CPU core.

13. The method of claim 10, wherein a faulty status bit associated with the faulty cache line is used to indicate that the faulty cache line is faulty.

14. The method of claim 10, wherein the faulty cache line is determined to be faulty by performing one of a built-in self test (BIST) or a power-on self test (POST).

15. The method of claim 10, wherein the cache is a last level cache.

16. A method for utilizing a faulty cache line in a cache, the method comprising:
   detecting, by a cache controller, a cache miss event;
   determining that the faulty cache line is selected for eviction based on a cache replacement policy, wherein a faulty cache line is a cache line that has an amount of erroneous memory locations that cannot be written or read correctly, while the rest of the cache line is functioning correctly; and
   evicting the faulty cache line if the cache miss event resulted from a cache access by a graphics processing unit (GPU).

17. The method of claim 16, further comprising:
   evicting a fault-free cache line instead of the faulty cache line if the cache miss event resulted from a cache access by a central processing unit (CPU) core.

18. The method of claim 16, wherein a faulty status bit associated with the faulty cache line is used to indicate that the faulty cache line is faulty.

19. The method of claim 16, wherein the faulty cache line is determined to be faulty by performing one of a built-in self test (BIST) or a power-on self test (POST).

20. The method of claim 16, wherein the cache is a last-level cache.

21. A method for reducing a power consumption of a microprocessor, the method comprising:
   lowering a supply voltage to the microprocessor to cause one or more cache lines in a cache to become faulty, wherein a faulty cache line is a cache line that has an amount of erroneous memory locations that cannot be written or read correctly, while the rest of the cache line is functioning correctly;
   identifying which of the cache lines are faulty cache lines; and
   for each cache access request to one of the faulty cache lines:
      allowing the cache access request to proceed if the cache access request is from a graphics processing unit (GPU) of the microprocessor, but not a central processing unit (CPU) core; and
      remapping the cache access request to access a fault-free cache line if the cache access request is from a CPU core of the microprocessor.

22. The method of claim 21, wherein each of the cache lines includes a faulty status bit to indicate whether that cache line is faulty.

23. The method of claim 21, wherein the step of identifying which of the cache lines are faulty cache lines includes performing one of a built-in self test (BIST) or a power-on self test (POST).

24. The method of claim 21, wherein the cache is a last-level cache.

* * * * *